(12) United States Patent
Lee

(10) Patent No.: US 7,232,736 B2
(45) Date of Patent: Jun. 19, 2007

(54) SEMICONDUCTOR DEVICES WITH CAPACITORS OF METAL/INSULATOR/METAL STRUCTURE AND METHODS FOR FORMING THE SAME

(75) Inventor: Ki-Young Lee, Kyunggi-do (KR)

(73) Assignee: Samsung Electronics, Co., Ltd. (KR)

( * ) Notice: Subject to any disclaimer, the term of this patent is extended or adjusted under 35 U.S.C. 154(b) by 319 days.

(21) Appl. No.: 11/027,056

(22) Filed: Dec. 30, 2004

(65) Prior Publication Data

US 2005/0118797 A1    Jun. 2, 2005

Related U.S. Application Data

(62) Division of application No. 10/285,883, filed on Nov. 1, 2002, now Pat. No. 6,853,003.

(30) Foreign Application Priority Data

Dec. 5, 2001    (KR) ................ 2001-76518

(51) Int. Cl.
 *H01L 21/20* (2006.01)
(52) U.S. Cl. ............... 438/399; 438/396; 438/397; 438/957; 438/FOR. 220; 257/E21.008; 257/E21.011; 257/E21.021
(58) Field of Classification Search ............ 438/396, 438/397, 399, 957, FOR. 220; 257/E21.008, 257/E21.011, E21.021
See application file for complete search history.

(56) References Cited

U.S. PATENT DOCUMENTS 6,124,198 A    9/2000 Moslehi 6,346,741 B1 *    2/2002    Van Buskirk et al. ...... 257/664
6,417,537 B1    7/2002    Yang et al.
6,452,251 B1    9/2002    Bernstein
6,744,090 B2 *    6/2004    Kim ........................ 257/301

FOREIGN PATENT DOCUMENTS

JP    2000-208743    7/2000

(Continued)

OTHER PUBLICATIONS

Armacost, M., et al., A High Reliability Metal Insulator Metal Capacitor for 0.18 Copper Technology, IEEE, 2000.

*Primary Examiner*—Matthew Smith
*Assistant Examiner*—Thanh V. Pham
(74) *Attorney, Agent, or Firm*—Mills & Onello, LLP

(57) ABSTRACT

Semiconductor devices with copper interconnections and MIM capacitors and methods of fabricating the same are provided. The device includes a lower electrode composed of a first copper layer. A first insulation layer covers a lower electrode. A window is formed in the first insulation layer to expose a portion of the lower electrode. A capacitor includes a lower barrier electrode, a dielectric layer, and an upper barrier electrode, which are sequentially formed to cover a sidewall and a bottom of the window. An intermediate electrode composed of a second copper layer fills a remaining space of an inside of the capacitor. A second insulation layer is formed on the intermediate electrode. A connection hole is formed in the second insulation layer to expose a portion of the intermediate electrode. A connection contact plug composed of a third copper layer fills the connection hole. An upper layer composed of a fourth copper layer is formed on the connection contact plug to be connected to the connection contact plug.

10 Claims, 8 Drawing Sheets

| | FOREIGN PATENT DOCUMENTS | | KR | 2000-0055260 | 9/2000 |
|---|---|---|---|---|---|
| JP | 2001-313373 | 9/2001 | | | |
| KR | 2000-0053454 | 8/2000 | * cited by examiner | | |

SEMICONDUCTOR DEVICES WITH CAPACITORS OF METAL/INSULATOR/METAL STRUCTURE AND METHODS FOR FORMING THE SAME

RELATED APPLICATION

This application is a divisional of U.S. application Ser. No. 10/285,883, filed on Nov. 1, 2002, now U.S. Pat. No. 6,853,003 which relies for priority upon Korean Patent Application No. 2001-76518, filed on Dec. 5, 2001, the contents of which are herein incorporated by reference in their entirety.

FIELD OF THE INVENTION

The present invention relates to semiconductor devices with capacitors of a metal/insulator/metal (MIM) structure (hereinafter referred to as MIM capacitors) and methods for fabricating the same. More particularly, the present invention relates to semiconductor devices with multiple copper interconnections and MIM capacitors and methods for fabricating the same.

BACKGROUND OF THE INVENTION

MIM capacitors have been extensively used for semiconductor devices related to analog-to-digital conversion and digital-to-analog conversion of apparatuses employing analog signals. Conversion between analog signals and digital signals requires capacitors and resistors. Also, as signals of which bits are numerous are used to increase the amount of data processed in data signals, semiconductor devices for processing signals should provide a reliable discrimination about shapes of signals. Also, the shapes of signals should not change with such variables as voltage and temperature. If capacitors of semiconductor devices have different capacitances according to voltage or temperature, it becomes impossible to exactly determine and process signals.

However, in case of using polysilicon for capacitor electrodes, electric charges can be easily emitted through boundaries between the capacitor electrode and a dielectric layer. Dependence of polysilicon upon temperature and voltage makes a capacitance change within a significantly wide range. For this reason, capacitors of the foregoing structure are not used for semiconductor devices, which need small size and high stability. Therefore, MIM capacitors are mainly adopted for analog semiconductor devices.

Generally, formation of an MIM capacitor comprises forming a multiple layer structure of aluminum interconnections, which includes an upper interconnection, a via, and a lower interconnection, and at the same time forming lower and upper electrodes of the capacitor. FIG. 1 is a cross-sectional view of a conventional MIM capacitor and conventional aluminum interconnections. Referring to FIG. 1, an interlayer insulation layer 15 is stacked on an aluminum lower electrode 11 and an aluminum lower interconnection 13. A window, which exposes the lower electrode 11, is formed in the interlayer insulation layer 15. A dielectric layer 17 is conformally stacked on an entire surface of a semiconductor substrate, and a via contact hole is formed to expose the lower interconnection 13. An aluminum layer is then stacked on an entire surface of the semiconductor substrate and patterned to form an upper electrode 19, an upper interconnection 21, and a via contact 23.

Laborious research for copper interconnections and copper capacitor electrodes has been conducted recently in order to increase stability and discrimination about signals of semiconductor devices. This is because copper has lower resistance and higher discrimination as compared with aluminum. However, in the case of using copper for interconnections and electrodes of the MIM capacitors, the interconnections and the electrodes cannot be easily patterned through conventional photolithographic and etching processes. Accordingly, a damascene process is performed instead. A copper damascene process comprises forming a groove for an interconnection in an insulation layer, stacking copper to fill the groove, and removing the copper from the substrate excluding the groove. However, since copper may be diffused to contaminate adjacent interlayer insulation layers and induce functional problems, the copper is covered with a barrier layer. Consequently, in the case that copper is used for electrodes of the MIM capacitor, it is difficult to apply conventional processes for fabricating aluminum MIM capacitors and aluminum interconnections.

FIG. 2 is a cross-sectional view illustrating an example of an MIM capacitor with a copper electrode in a conventional semiconductor device using a copper interconnection ("A high reliability metal insulator metal capacitor for 0.18 um copper technology" by M. Armacost et al., 2000, IEEE).

Referring to FIG. 2, a capacitor 43 is formed on a semiconductor substrate 30, and the capacitor 43 is covered with lower and upper nitride layers 31 and 33. The capacitor 43 includes a base oxide layer 35, a lower electrode 37, a dielectric layer 39, and an upper electrode 41. In this case, an area of the upper electrode 41 is smaller than that of the lower electrode 37. The upper and lower electrodes 37 and 41 of the capacitor 43 are thin metal layers like TiN. An interlayer insulation layer 45 is formed on the upper nitride layer 33. A groove and a via contact hole are formed in the interlayer insulation layer 45 and filled with a barrier metal 47 and a copper layer 49. The barrier metal 47 and the copper layer 49 are polished by chemical mechanical polishing (CMP) to form interconnections. The interconnections, which are formed of the barrier metal 47 and the copper layer 49 that fill the groove and the via contact hole, are connected to the upper and lower electrodes 37 and 41, respectively, through a contact plug.

In this case, however, photolithographic process should be performed more than twice to fabricate a capacitor. Also, it grows difficult to fabricate a via contact hole due to a complicated stacked structure. In addition, an entire substrate exhibits poorer step coverage by stacking a multiple layer for the capacitor. As a result, the CMP process is required to improve the step coverage.

FIGS. 3 through 6 are cross-sectional views illustrating an example of forming an MIM capacitor and an interconnection in a semiconductor device using a copper interconnection. A lower electrode 53 and a lower interconnection 55 are formed in an insulation layer 51 formed on a substrate using a damascene process, and then an interlayer insulation layer 57 is formed. The interlayer insulation layer 57 is patterned to form a via contact hole 61 and a window 63, then a dielectric layer 59 is stacked on the resultant structure (see FIG. 3). A groove 65 for an upper interconnection is, using a photoresist pattern (not shown), formed on the interlayer insulation layer 57 (see FIG. 4). The groove 65, the via contact hole 61, and the window 63 are filled with a conductive layer to form an upper electrode 66, an intermediate interconnection 67, and a contact plug 68 (see FIG. 5). After stacking and patterning another interlayer insulation layer 71, an upper interconnection layer is stacked and patterned to form an upper contact plug 73 and an upper interconnection 72.

In the foregoing method, the interlayer insulation layer 57 and the dielectric layer 59 are selectively etched to form the groove 65. The groove 65 is formed to remove the dielectric layer 59 under the via contact hole 61, while the dielectric layer 59 still remains on the bottom of the window 63.

In this case, the via contact hole 61 should be maintained to be an appropriate depth. If the via contact hole 61 is formed too deeply, the lower interconnection may be easily attacked during an etching process for forming the via contact hole 61, and it becomes difficult to fill the via contact hole with interconnection metal due to a high aspect ratio of the via contact hole. Besides, the dielectric layer remaining on sidewalls of the via contact hole 61 lessens a width of the via contact hole 61. This makes it difficult to fill the via contact hole 61 with a conductive material. In addition, if the dielectric layer is not completely removed from bottom of the via contact hole 61, a contact resistance may be increased.

SUMMARY OF THE INVENTION

Therefore, the present invention is directed at solving problems that may arise during fabricating semiconductor devices with MIM capacitors using copper as electrodes. The present invention provides semiconductor devices with MIM capacitors employing copper, of which resistance is lower than aluminum, for interconnection layers and electrodes of capacitors and methods for fabricating the same, which can simplify fabricating processes.

Specifically, it is an object of the present invention to provide semiconductor devices with MIM capacitors and methods of fabricating the same, which can minimize changes of characteristics according to temperature changes and voltage variations.

It is another object of the present invention to provide semiconductor devices with MIM capacitors and methods of fabricating the same, which can simplify processes by performing photolithographic processes fewer times.

In accordance with the present invention, provided is a semiconductor device including a lower electrode with a first copper layer. A first interlayer insulation layer covers the lower electrode. A window is formed in the first insulation layer to expose a portion of the lower electrode. A metal/insulator/metal (MIM) capacitor includes a lower barrier electrode, a dielectric layer, and an upper barrier electrode, which are sequentially stacked to cover a sidewall and a bottom of the window. An intermediate electrode includes a second copper layer to fill a remaining inner space of an inside of the capacitor. A second interlayer insulation layer is formed on the intermediate electrode. A connection contact hole is formed in the second insulation layer to expose a portion of the intermediate electrode. A connection contact plug includes a third copper layer to fill the connection contact hole. An upper electrode, which includes a fourth copper layer, is formed on the connection contact plug to be connected to the connection contact plug.

In the present invention, a capacitor electrode and an interconnection are preferably formed together. For example, the semiconductor device may comprise a lower interconnection formed together with the lower electrode, an upper interconnection formed together with the upper electrode, and a via contact plug, which connects the lower and upper interconnections and is formed together with the connection contact plug.

Preferably, an insulation barrier layer is disposed under the first insulation layer to be in direct contact with the lower electrode and lower interconnection. Another insulation barrier layer is preferably disposed under the second insulation barrier layer to be in direct contact with the intermediate electrode. In this case, these insulation layers may be silicon nitride layers or silicon carbide layers, and have a thickness of 200 to 1000 angstroms.

In addition, the first and second insulation layers are preferably fluoro silicate glass (FSG) layers or black diamond layers, which may prevent formation of parasitic capacitors due to their low dielectric constant.

In the present invention, generally, the connection contact plug has the same constituent layers and structure as the via contact plug, and the upper electrode has the same constituent layers and structure as the upper interconnection. In particular, in case of dual damascene process, the connection contact plug, the via contact plug, the upper electrode, and the upper interconnection may have the same constituent layers including a copper layer and a barrier metal layer.

Forming the upper electrode comprises forming a third insulation layer on a substrate where the connection contact plug is formed, forming a groove in the third insulation layer by a damascene process to expose the connection contact plug, and filling a conductive layer including a copper layer in the groove.

The upper and lower barrier electrodes may be at least one selected from the group consisting of a titanium nitride layer, a tantalum nitride layer, a tantalum silicon nitride layer, a titanium silicon nitride layer, and a tungsten nitride layer. In this case, the upper and lower barrier electrodes may be formed to have a thickness of 300 to 500 angstroms.

The dielectric layer may be at least one selected from the group consisting of a silicon oxide layer, a silicon nitride layer, a silicon carbide layer, an aluminum oxide layer, and a tantalum oxide layer. A thickness of the dielectric layer may range from 200 to 1000 angstroms.

Since copper may be easily diffused, interconnections and electrodes including contact plugs, which are made of copper, should be separated from exterior layers by conductive materials or insulating layers, which are used as barriers against diffusion of copper.

The present invention provides a method of fabricating a semiconductor device with an MIM capacitor, which comprises forming a lower electrode composed of a conductive layer including a first copper layer on a substrate. A first insulation layer covers the lower electrode. The first insulation layer is patterned to form a window exposing a portion of the lower electrode. A lower barrier electrode layer, a dielectric layer, and an upper barrier electrode layer are conformally formed on a surface of the substrate where the window is formed. A conductive layer including a second copper layer is stacked and filled in a remaining space of the window. A planarizing etch process is performed into the substrate where the conductive layer including the second copper layer is formed, thereby exposing a top of the first insulation layer and forming a capacitor including a lower barrier electrode, a dielectric layer pattern, an upper barrier electrode and an intermediate electrode. A second insulation layer is formed on substrate where the intermediate electrode is formed. After forming an etch mask on the second insulation layer, layers under the etch mask are etched to form a connection contact hole exposing a portion of the intermediate electrode. A conductive layer including a third copper layer is filled in the connection contact hole.

In the present invention, after filling the connection contact hole with the conductive layer, an interlayer insulation layer is generally stacked. Thereafter, the interlayer insulation layer is patterned to form a groove for interconnection exposing the conductive layer. The groove is then filled with a conductive layer including a fourth copper layer. In another method, photolithography and etching may be additionally performed to form a groove for an upper electrode on the second insulation layer, before or after forming the connection contact hole. Continuously, a conductive layer including a third copper layer may be stacked to fill the contact hole as well as the groove for the upper electrode. After forming the upper electrode, an insulation layer of which lower layer is an insulation barrier layer is additionally formed thereon.

Preferably, the lower electrode including the first copper layer and a connection contact plug composed of the conductive layer including the third copper layer are formed of a barrier metal layer and a copper layer, which are sequentially stacked.

Forming the copper layer preferably comprises forming a seed layer by CVD or sputtering, then forming a bulk layer on the seed layer by electroplating.

The capacitor electrode is preferably formed together with an interconnection. Accordingly, a lower interconnection is formed together while forming the lower electrode, and a portion of a via contact hole, which connects upper and lower interconnections, is formed together when the connection contact hole is formed. Also, while filling the connection contact hole, the via contact hole is preferably filled with the conductive layer including the third copper layer.

In particular, in the case of employing dual damascene process, forming the second insulation layer is followed by forming a third insulation layer. An etch mask is then formed on the third insulation layer, while forming the connection contact hole. Grooves for both an upper electrode and an upper interconnection are formed on the third insulation layer before or after forming the connection contact hole. The via contact hole, the groove for the upper electrode, and the groove for the upper interconnection may be filled while filling the connection contact hole.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1:
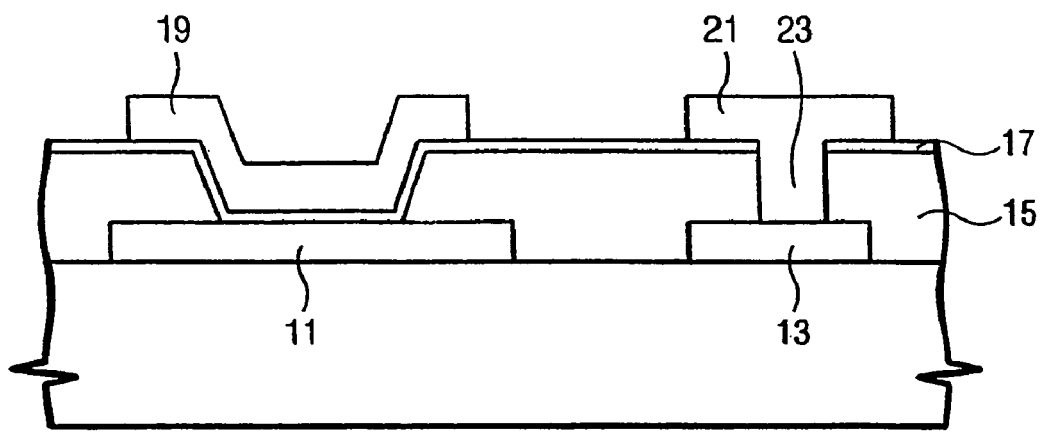
FIG. 1 is a cross-sectional view of a conventional MIM capacitor and conventional aluminum interconnections.
Figure 2:
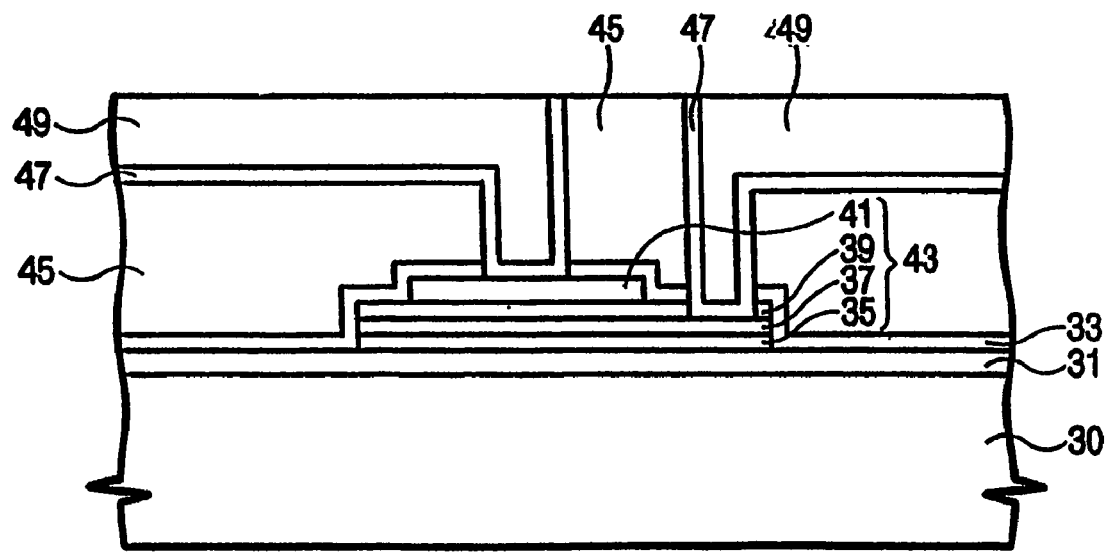
FIG. 2 is a cross-sectional view illustrating an example of an MIM capacitor with a copper electrode in a conventional semiconductor device using a copper interconnection.
Figure 3:
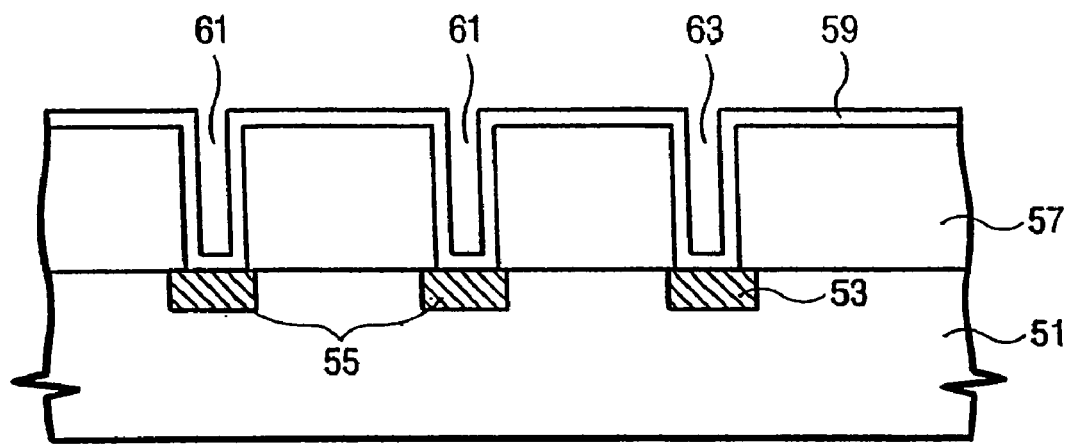
FIGS. 3 through 6 are cross-sectional views illustrating an example of forming an MIM capacitor and an interconnection in a semiconductor device using a copper interconnection.
Figure 4:
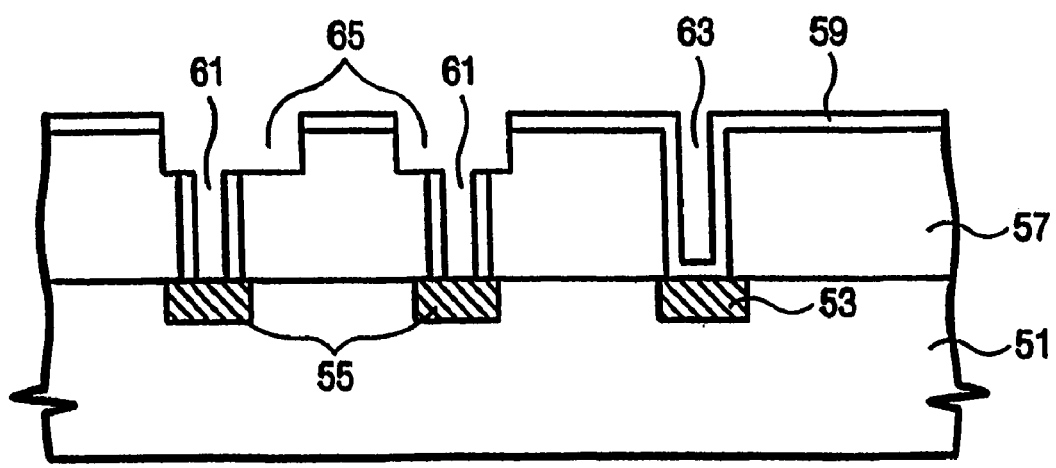
Figure 5:
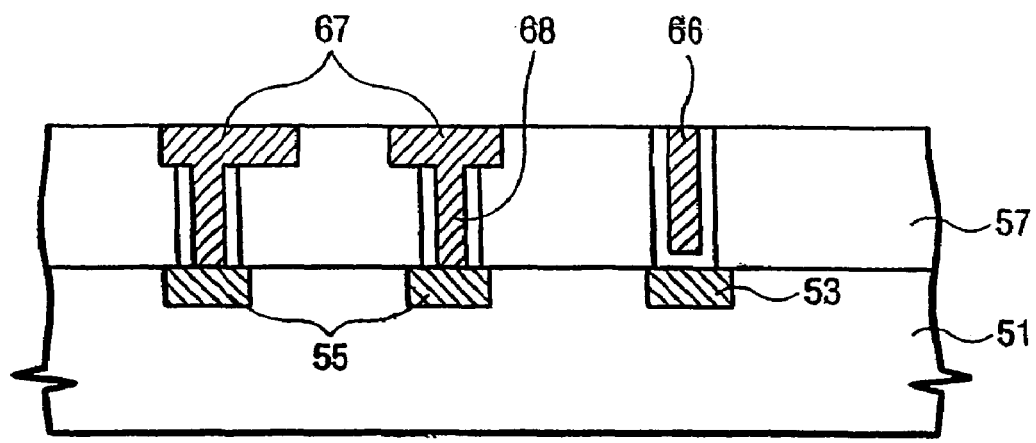
Figure 6:
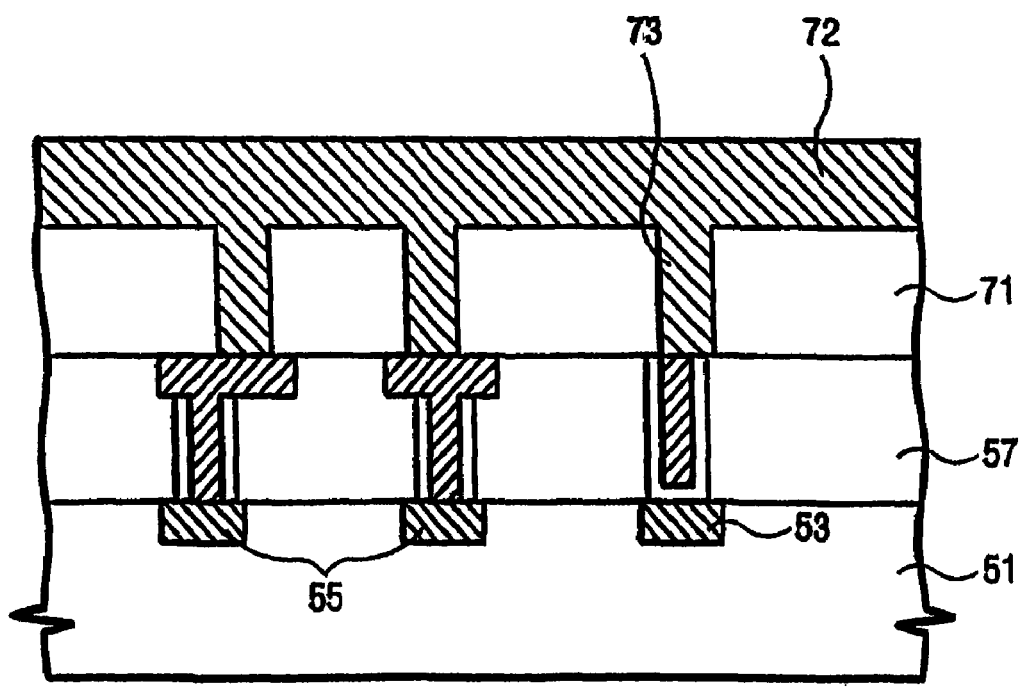

The present invention will now be described more fully hereinafter with reference to the accompanying drawings, in which preferred embodiments of the invention are shown. In the drawings, the thickness of layers and regions are exaggerated for clarity. It will also be understood that when a layer is referred to as being "on" another layer or substrate, it can be directly on the other layer or substrate, or intervening layers may also be present.

Embodiment 1

Figure 7:
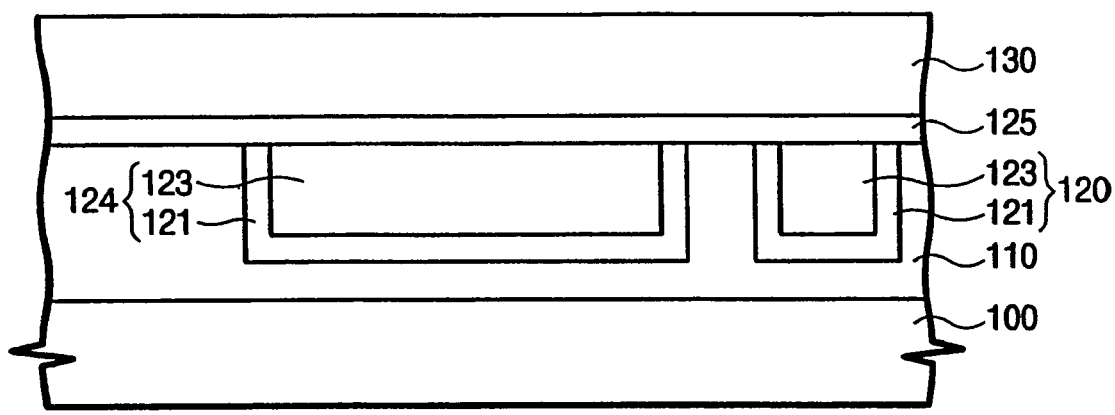
FIGS. 7 through 12 are cross-sectional views illustrating a first preferred embodiment of the present invention.

Referring to FIG. 7, a groove for a lower electrode and a groove for a lower interconnection are formed in a lower substrate 100 where a lower insulation layer 110 is formed. A first barrier metal layer 121 is thinly stacked by sputtering on the substrate where the grooves are formed, and a first copper layer 123 is stacked to fill the grooves. Generally, forming a copper layer preferably comprises forming a seed layer by sputtering to have a thickness of 500 to 2000 angstroms, then forming a remaining layer thereon by electroplating. The lower electrode of the present invention may have a larger width as compared with lower electrodes of conventional analog semiconductor devices, which have a width of 3000 to 10000 angstroms. The barrier metal layer is typically composed of TaN or TiN.

The first copper layer is polished by chemical mechanical polishing (CMP), until a top of the lower insulation layer 110 is exposed, such that the first copper layer 123 and the first barrier metal layer 121 remain only in the grooves. Thus, the lower electrode and the lower interconnection are separated from each other. A first capping layer 125, which is an insulation barrier layer for preventing diffusion of copper, is stacked on the exposed lower insulation layer 110 as well as the lower interconnection 120 and the lower electrode 124, which are formed of the remaining first copper layer 123 and first barrier metal layer 121. The insulation barrier layer is typically a silicon nitride layer or a silicon carbide layer and is formed to have a thickness of 200 to 1000 angstroms. A first insulation layer 130 is stacked on the first capping layer 125. The first capping layer 125 and the first insulation layer 130 may be regarded as a single interlayer insulation layer, i.e., a first interlayer insulation layer. The first interlayer insulation layer may be formed of only one insulation layer, which exhibits characteristics as a copper barrier. The first insulation layer 130 is formed to have a thickness of 2000 to 5000 angstroms. In addition, the first insulation layer is preferably a fluoro silicate glass layer or a black diamond layer, of which dielectric constant is low, to prevent the influence of parasitic capacitors in a semiconductor device.

Figure 8:
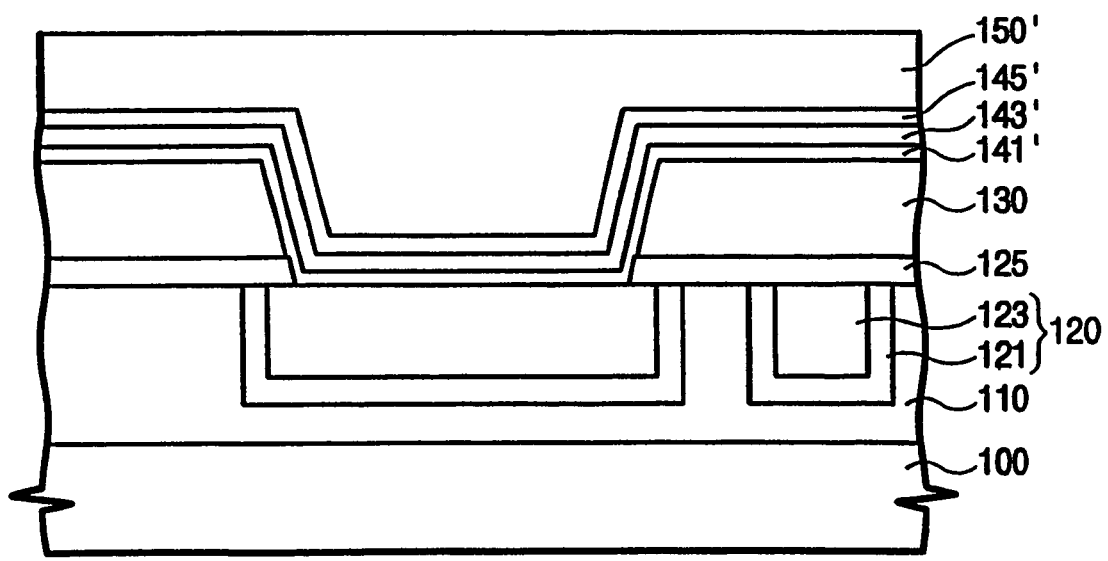

Referring to FIG. 8, the first interlayer insulation layer, which is formed of the first capping layer 125 and the first insulation layer 130, is patterned to form a window exposing a major portion of the lower electrode 124. A lower barrier electrode layer 141', a dielectric layer 143', and an upper barrier electrode layer 145' are sequentially formed on a surface of the substrate where the window is formed. A second copper layer 150' is stacked on the upper barrier electrode layer 145'.

The lower and upper barrier electrode layers 141' and 145' are thinly formed to have a thickness of 200 to 1500 angstroms, respectively. The lower and upper barrier electrode layers 141' and 145' may be composed of conductive materials for preventing diffusion of copper, for example, at least one selected from the group consisting of a tantalum nitride layer, a titanium nitride layer, a tantalum silicon nitride layer, a titanium silicon nitride layer, and a tungsten nitride layer. The dielectric layer 143' may be a silicon oxide layer obtained by chemical vapor deposition (CVD), or at least one selected from the group consisting of a silicon nitride layer, a silicon carbide layer, an aluminum oxide layer, and a tantalum oxide layer. A thickness of the dielectric layer 143' is determined in consideration of a capacitance of a capacitor. Forming of the second copper layer 150', like other copper layers, comprises thinly forming a seed layer using sputtering or CVD, then forming a remaining layer using electroplating.

Figure 9:
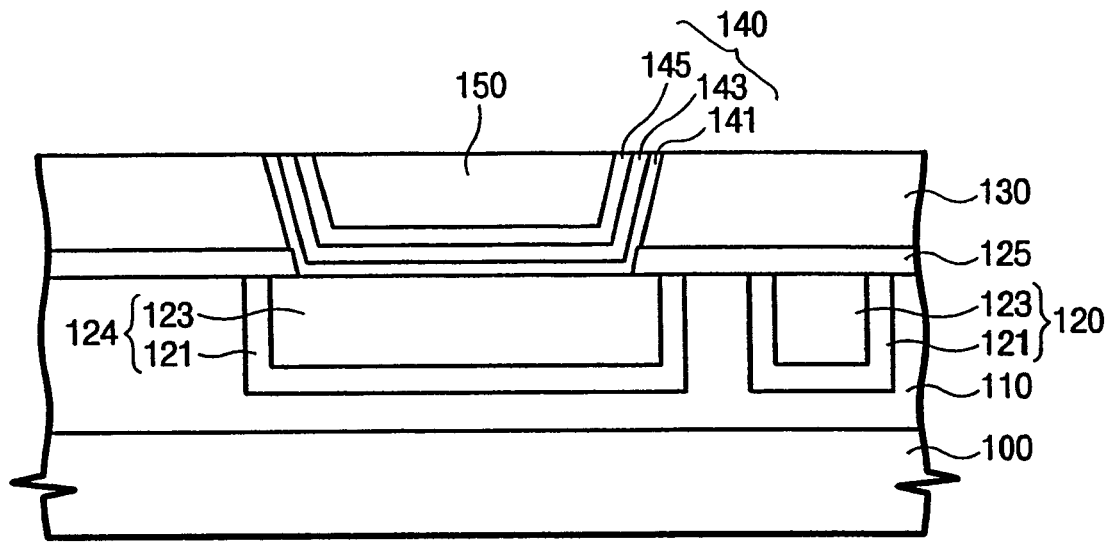

Referring to FIG. 9, a CMP process is performed into the substrate where the second copper layer 150' is formed, until a top of the first insulation layer 130 is exposed. Thus, a bottom and a sidewall of the window are covered with a lower barrier electrode 141, a dielectric layer pattern 143, and an upper barrier electrode 145, which constitute the capacitor. The intermediate electrode 150 composed of the second copper layer remains on the upper barrier electrode 145, thereby filling a remaining space of the window.

Figure 10:
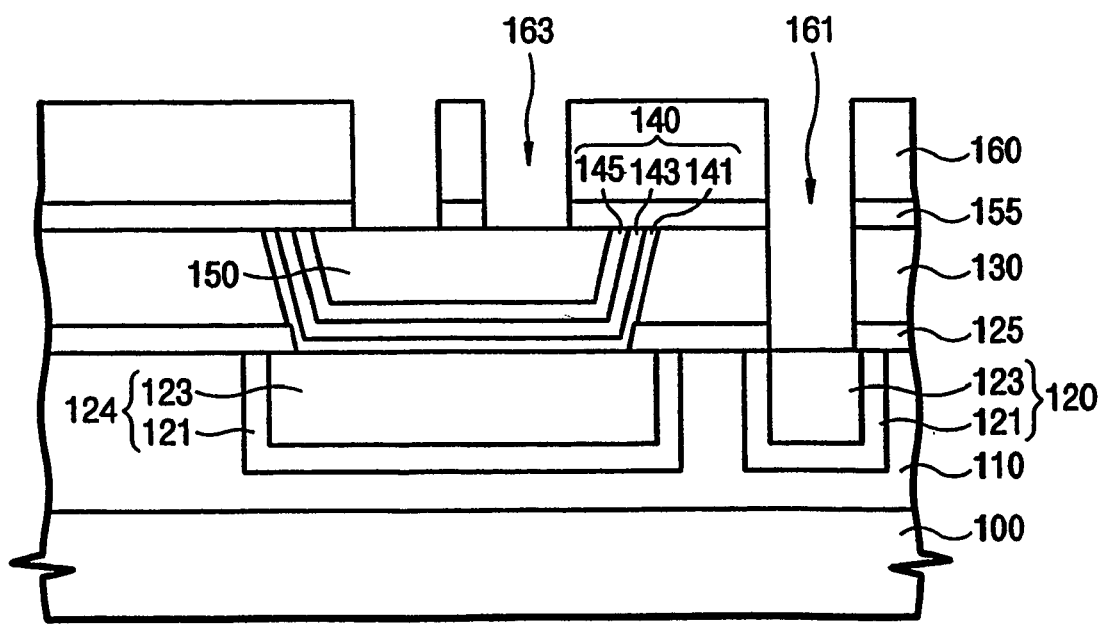

Referring to FIG. 10, a second capping layer 155 is formed on an entire surface of the substrate where the intermediate electrode 150 is formed, so as to prevent diffusion of the second copper layer constituting the intermediate electrode 150. The second capping layer 155 and the second insulation layer 160 constitute a second interlayer insulation layer. The second capping layer 155 and the second insulation layer 160 are formed to the same thickness as the first capping layer 125 and the first insulation layer 130, respectively. The second capping layer 155 and the second insulation layer 160 are composed of the same materials as the first capping layer 125 and the first insulation layer 130, respectively. A connection contact hole 163 and a via contact hole 161 are formed to expose the intermediate electrode 150 and a portion of the lower interconnection 120. The contact holes 161 and 163 are formed using a conventional photolithographic process. The second interlayer insulation layer is etched at a region where the connection contact hole 163 is disposed, until the intermediate electrode 150 composed of the second copper layer is exposed. By comparison, the second and first interlayer insulation layers are sequentially etched at a region where the via contact hole 161 is formed, until the lower electrode 120 composed of the first copper layer is exposed.

Figure 11:
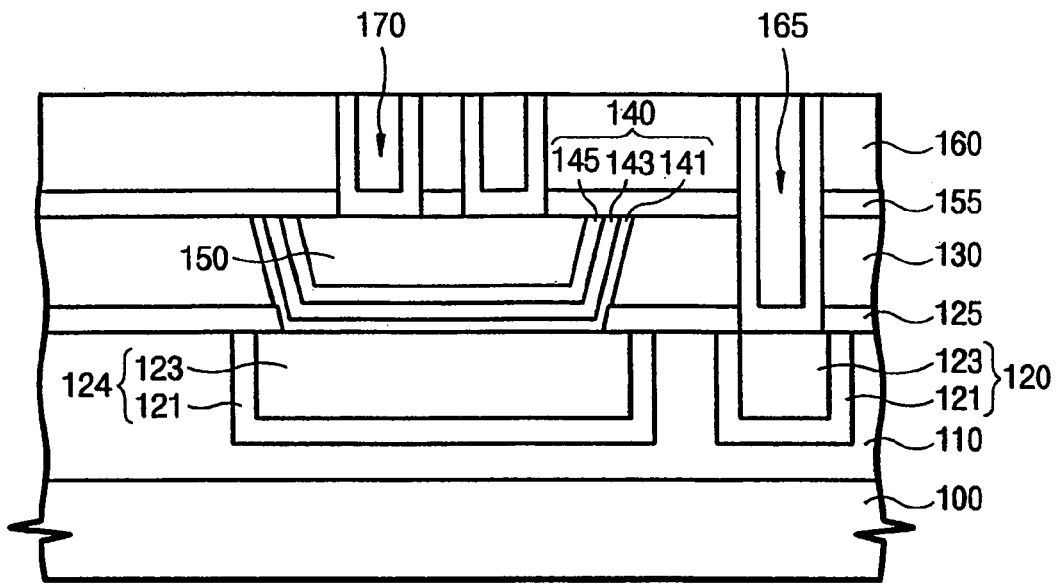

Referring to FIG. 11, a second barrier metal layer and a third copper layer are sequentially stacked on an entire surface of the substrate where the contact holes 161 and 163 are formed, thereby filling the contact holes 161 and 163. The fabricating step is performed in the same manner as forming the lower electrode 124 and the lower interconnection 120 by using the first barrier metal layer and the first copper layer. Since an aspect ratio of the via contact hole 161 becomes relatively higher, the barrier metal layer and the copper layer for a seed layer are preferably formed by CVD rather than sputtering. After filling the contact holes 161 and 163 with the barrier metal layer and the copper layer, a CMP process is performed to expose a top of the second interlayer insulation layer. As a result, a via contact plug 165 and a connection contact plug 170, which are separated from each other, are formed. The connection contact plug 170 is formed to a much less area or width than the intermediate electrode 150. This enables a plurality of the connection contact plug 170 to be connected to the intermediate electrode 150.

Figure 12:
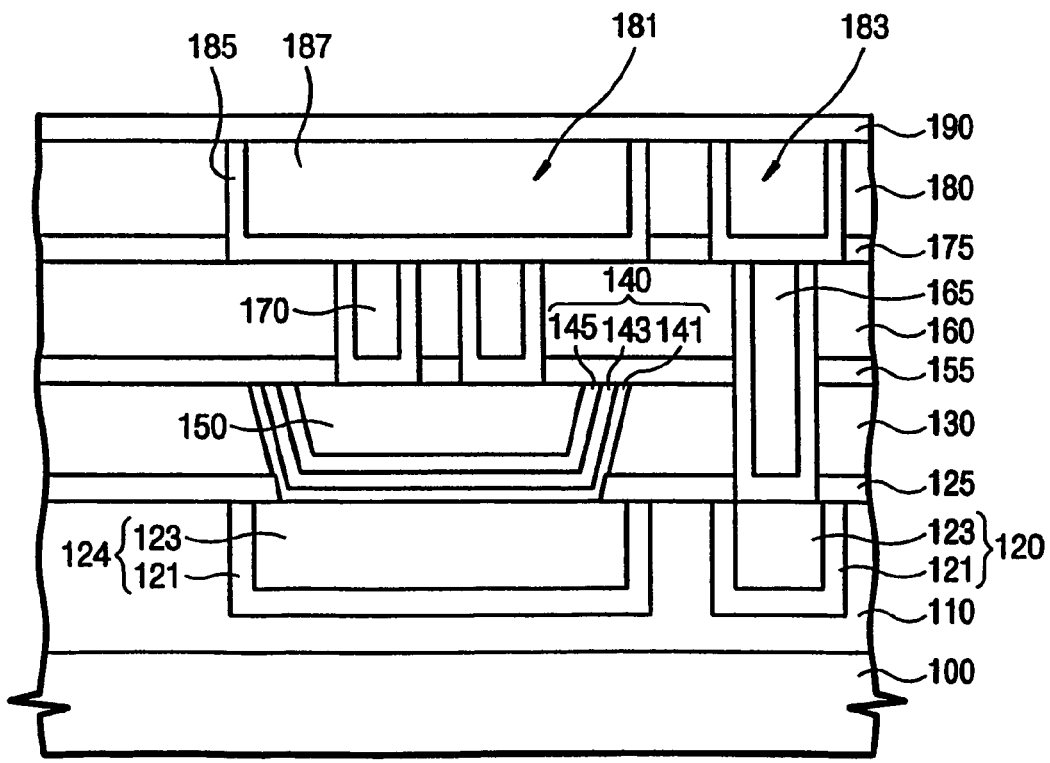

Referring to FIG. 12, a third capping layer 175 and a third insulation layer 180 are sequentially stacked on an entire surface of the substrate where the contact plugs are formed. The third capping layer 175 and the third insulation layer 180 constitute a third interlayer insulation layer. The third interlayer insulation layer is patterned to form a groove for an upper electrode exposing the connection contact plug 170 and a groove for an upper interconnection exposing the via contact plug 165. Thereafter, a third barrier metal layer 185 and a fourth copper layer 187 are stacked on an entire surface of the substrate. A damascene process including CMP is performed into the substrate to form the upper electrode 181 and the upper interconnection 183. A fourth capping layer 190 is stacked on the upper interconnection 183 and the upper electrode 181. In the foregoing steps, an MIM capacitor is formed together with a copper interconnection. Besides, a photolithographic process for forming the capacitor substantially may be reduced to one time, that is, only when the window is formed in the first interlayer insulation layer.

Embodiment 2

In comparison with Embodiment 1 including the single damascene process, Embodiment 2 includes a dual damascene process. To begin with, a structure as illustrated in FIG. 9 of Embodiment 1 is formed.

Figure 13:
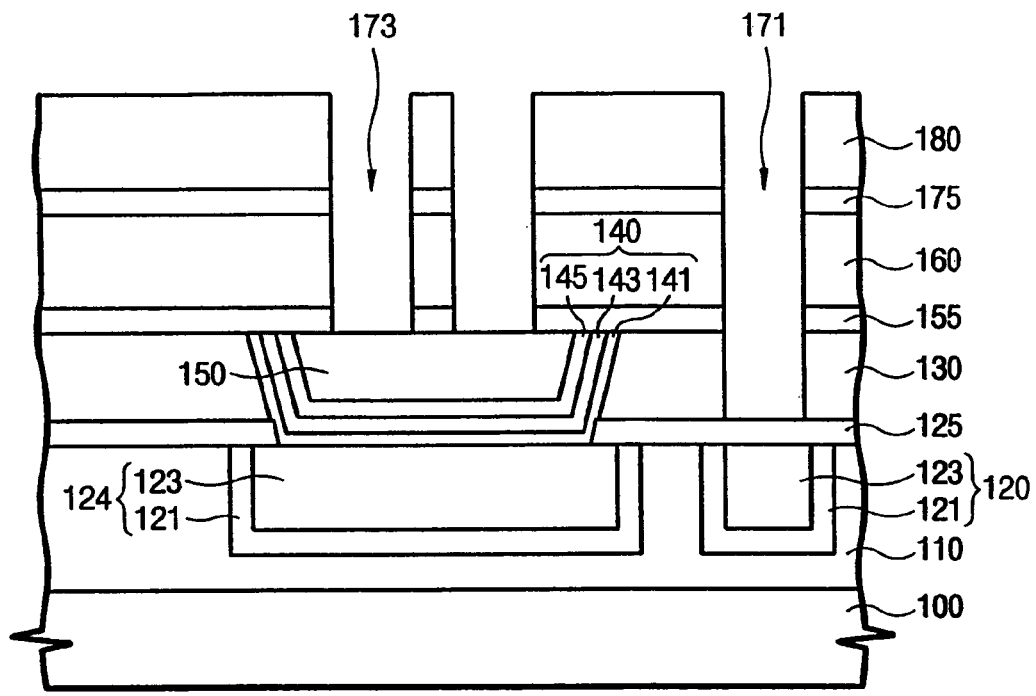
FIGS. 13 through 15 are cross-sectional views illustrating a second preferred embodiment of the present invention.

Thereafter, referring to FIG. 13, a second capping layer 155, a second insulation layer 160, a third capping layer 175, and a third insulation layer 180 are sequentially stacked on the substrate where an intermediate electrode is formed. The fabricating steps of the capping layers and the insulation layers are the same as those of Embodiment 1. The second and third insulation layer 160 and 180 are generally formed to have a thickness of 2000 to 3000 and 4000 to 8000 angstroms, respectively.

Next, a via contact hole, a connection contact hole, an upper interconnection, and an upper electrode are formed. As illustrated in FIG. 13, the via contact hole 171 and the connection contact hole 173 are formed using conventional photolithography and etching. Third and second interlayer insulation layers are etched at a region where the connection contact hole is formed, until an intermediate electrode 150 including a second copper layer is exposed. However, the third, second, and first interlayer insulation layers are sequentially etched at a region where the via contact hole is formed, until a first capping layer 125 is exposed.

Figure 14:
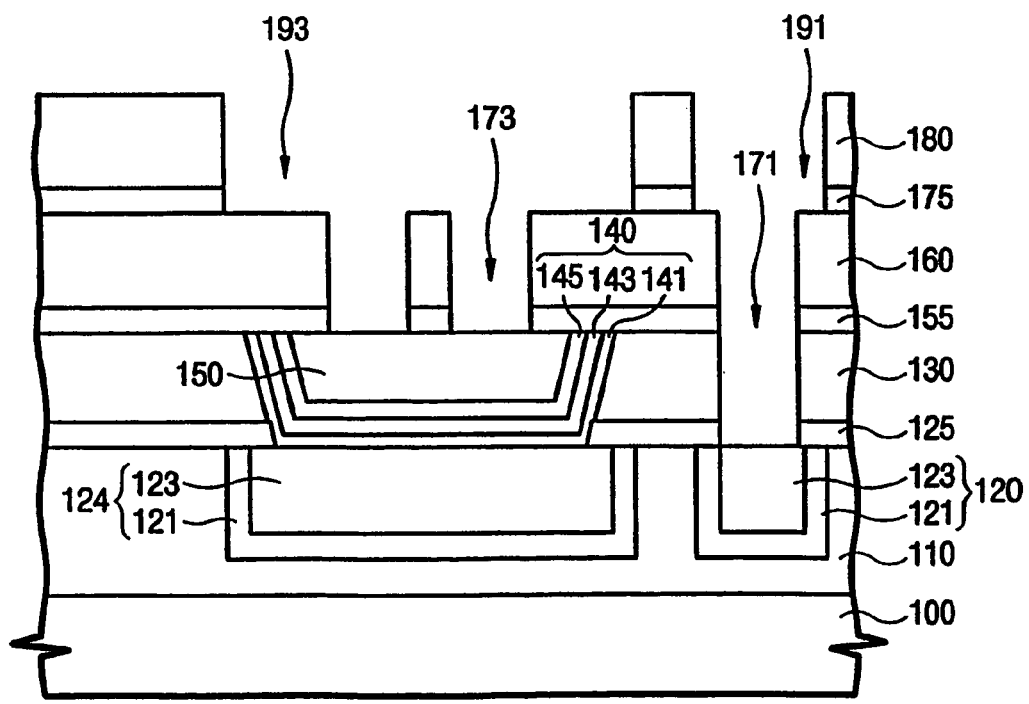

Referring to FIG. 14, a photoresist pattern (not shown), which defines an upper electrode and upper interconnection, is formed on the substrate. By using the photoresist pattern as an etch mask, an etching process is carried out. While etching the third capping layer 175, the first capping layer 125 under the via contact hole 171 is removed together. Thus, a groove 193 for an upper electrode and a groove 191 for an upper interconnection are formed, while the intermediate and lower electrodes 150 and 120 are exposed.

Figure 15:
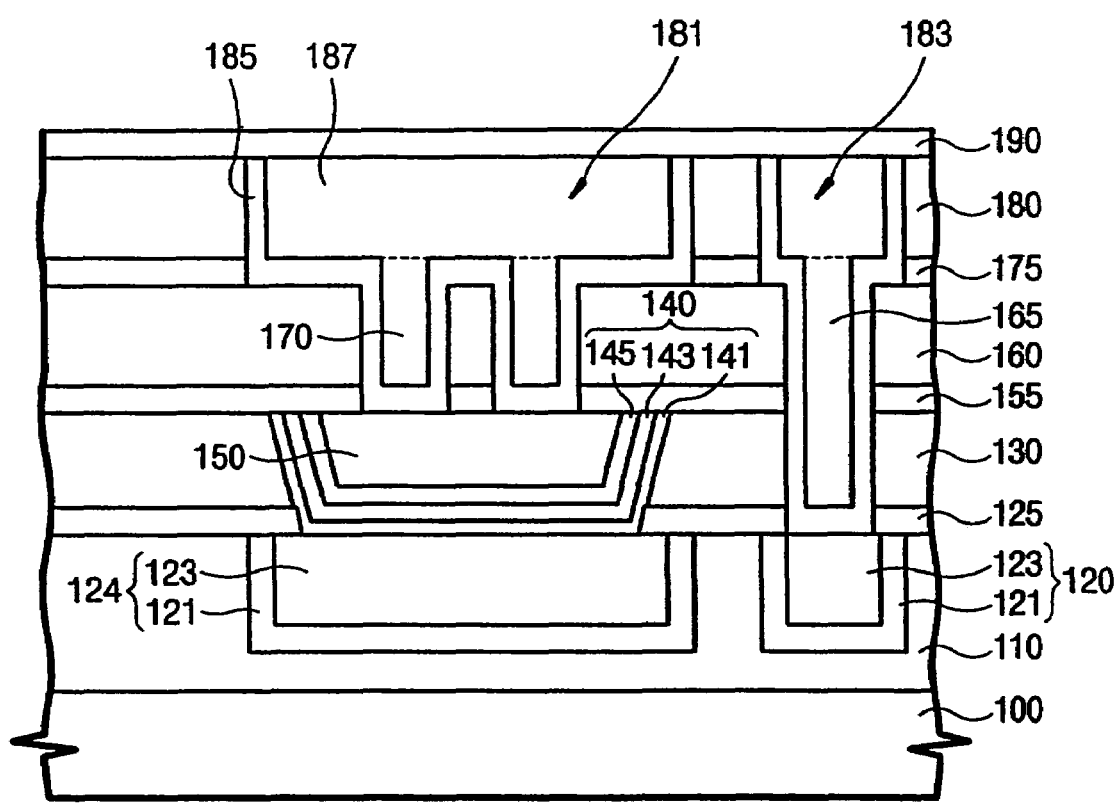

Referring to FIG. 15, a barrier metal layer 185 and a copper layer 187 are sequentially filled in the via contact hole 171, the connection contact hole 173, the groove 193 for the upper electrode, and the groove 191 for the upper interconnection, which are formed through the steps of FIGS. 13 and 14. The fabricating steps of the barrier metal layer 185 and the copper layer 187 are the same as those of Embodiment 1. The barrier metal layer and the copper layer, which are stacked on the third interlayer insulation layer 180, are removed by CMP. A capping layer is then formed to prevent diffusion of copper layers constituting the upper interconnection and the upper electrode.

According to the present invention, semiconductor devices with MIM capacitors can be formed using copper interconnection layers, in a similar manner of fabricating semiconductor devices with MIM capacitors using conventional aluminum interconnection layers. Accordingly, photolithographic processes can be performed fewer times, thereby enabling simplification of fabricating processes.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method of fabricating a semiconductor device, comprising:
    forming a lower electrode including a first copper layer on a substrate;
    forming a first insulation layer covering the lower electrode;
    patterning the first insulation layer to form a window exposing a portion of the lower electrode;
    conformally forming a lower barrier electrode layer, a dielectric layer, and an upper barrier electrode layer on a surface of the substrate where the window is formed, and stacking a conductive layer including a second copper layer to fill a remaining space of the window;
    performing a planarizing etch process into the substrate where the conductive layer including the second copper layer is stacked to expose a top of the first insulation layer, forming a capacitor including a lower barrier electrode, a dielectric layer pattern, an upper barrier electrode, and forming an intermediate electrode;
    forming a second insulation layer on the substrate where the intermediate electrode is formed;
    forming an etch mask on the second insulation layer and etching the layers under the etch mask to form a connection contact hole exposing a portion of the intermediate electrode; and
    filling the connection contact hole with a conductive layer including a third copper layer.

2. The method as claimed in claim 1, wherein the lower electrode including the first copper layer and the conductive layer including the third copper layer are formed of a barrier metal layer and a copper layer, which are sequentially stacked.

3. The method as claimed in claim 1, wherein forming the second insulation layer is followed by forming a third insulation layer,
    wherein, while forming the connection contact hole, the etch mask is formed on the third insulation layer,
    wherein a groove for the upper electrode is formed on the third insulation layer before or after forming the connection contact hole,
    and wherein the groove for the upper electrode is filled together while filling the connection contact hole.

4. The method as claimed in claim 1, wherein at least one of the first and second insulation layers is formed of an insulation barrier layer and a silicon oxide layer, which are sequentially stacked.

5. The method as claimed in claim 1, after filling the connection contact hole, further comprising:
    performing a planarizing etch process into the conductive layer including the third copper layer until a top of the second insulation layer is exposed to form a connection contact plug;
    forming and patterning a third insulation layer to form a groove for the upper electrode exposing a portion of the connection contact plug; and
    stacking a fourth copper layer and performing a planarizing etch process to form an upper electrode.

6. The method as claimed in claim 1, wherein at least one of the copper layers is formed of a seed layer formed by sputtering and a bulk layer formed by electroplating, which are sequentially stacked.

7. The method as claimed in claim 1, wherein at least one of the copper layers is formed of a seed layer formed by CVD and a bulk layer formed by electroplating, which are sequentially stacked.

8. The method as claimed in claim 1, wherein the lower electrode is formed on the substrate where the lower insulation layer is formed using damascene process.

9. The method as claimed in claim 1, further comprising:
    forming the lower interconnection together while forming the lower electrode;
    forming a portion of the via contact hole together while forming the connection contact hole; and
    filling the via contact hole with the conductive layer including the third copper layer while filling the connection contact hole.

10. The method as claimed in claim 9, wherein forming the second insulation layer is followed by forming a third insulation layer,
    wherein the etch mask is formed on the third insulation layer when the connection contact hole is formed,
    wherein the grooves for the upper electrode and the upper interconnection are additionally formed before or after forming the connection contact hole,
    and wherein the via contact hole, the groove for the upper electrode, and the groove for the upper interconnection are filled together while filling the connection contact hole.

* * * * *